United States Patent
Förster et al.

(10) Patent No.: US 7,326,953 B2
(45) Date of Patent: Feb. 5, 2008

(54) LAYER SEQUENCE FOR GUNN DIODE

(75) Inventors: Arnold Förster, Simmerath (DE);
Mihail Ion Lepsa, Jülich (DE); Jürgen Stock, Bedburg (DE)

(73) Assignee: Forschungszentrum Julich GmbH, Julich (DE)

( * ) Notice: Subject to any disclaimer, the term of this patent is extended or adjusted under 35 U.S.C. 154(b) by 153 days.

(21) Appl. No.: 10/539,997

(22) PCT Filed: Nov. 21, 2003

(86) PCT No.: PCT/DE03/03867

§ 371 (c)(1),
(2), (4) Date: Jun. 17, 2005

(87) PCT Pub. No.: WO2004/061990

PCT Pub. Date: Jul. 22, 2004

(65) Prior Publication Data

US 2006/0054928 A1    Mar. 16, 2006

(30) Foreign Application Priority Data

Dec. 20, 2002 (DE) ............... 102 61 238

(51) Int. Cl.
*H01L 29/06* (2006.01)
*H01L 47/02* (2006.01)
(52) U.S. Cl. .................. 257/6; 257/7; 257/8
(58) Field of Classification Search .......... 257/6–8
See application file for complete search history.

(56) References Cited

U.S. PATENT DOCUMENTS

| | | | | |
|---|---|---|---|---|
| 3,981,073 A | * | 9/1976 | Dully ................. 438/500 |
| 4,188,710 A | * | 2/1980 | Davey et al. ........... 438/508 |
| 4,212,020 A | * | 7/1980 | Yariv et al. ............ 372/50.1 |
| 4,914,489 A | * | 4/1990 | Awano ................ 257/6 |
| 4,945,393 A | | 7/1990 | Beltram et al. ....... 365/185.06 |
| 5,151,758 A | * | 9/1992 | Smith ................. 257/287 |
| 5,250,815 A | * | 10/1993 | Battersby et al. ........ 257/6 |
| 5,258,624 A | * | 11/1993 | Battersby et al. ........ 257/11 |

(Continued)

FOREIGN PATENT DOCUMENTS

JP    62020373    1/1987

OTHER PUBLICATIONS

Advances in Hot Electron Injector Gunn Diodes by Spooner et al. GEC Journal 7(1989).

(Continued)

*Primary Examiner*—Ida M. Soward
(74) *Attorney, Agent, or Firm*—Andrew Wilford

(57) ABSTRACT

The invention relates to a layered construction for a Gunn diode. The layered construction comprises a series of stacked layers consisting of a first highly doped $n_d$ GaAs layer (3), a graded AlGaAs layer (5), which is placed upon the first highly doped layer (3), whereby the aluminum concentration of this layer, starting from the boundary surface to the first $n_d$ GaAs layer (3), decreases toward the opposite boundary surface of the AlGaAs layer (5), and of a second highly doped $n^+$ layer (7). An undoped intermediate layer (4, 6) serving as a diffusion or segregation stop layer is placed on at least one boundary surface of the AlGaAs layer (5) to one of the highly doped layers (3, 7) and prevents an unwanted doping of the graded layer.

11 Claims, 2 Drawing Sheets

| Layer Number | Layer Material | Thickness of Layer A | Thickness of Layer B | Thickness of Layer C |
|---|---|---|---|---|
| 7 | $n^+$ GaAs | 500 nm | 500 nm | 500 nm |
| 6 | GaAs | - | - | 10 nm |
| 5 | GaAs→$Al_xGa_{1-x}As$ | 50 nm | 50 nm | 50 nm |
| 4 | GaAs | - | 5 nm | 10 nm |
| 3 | $n_d$ GaAs | 10 nm | 5 nm | 5 nm |
| 2 | $n^-$ GaAs | 1.6 μm | 1.6 μm | 1.6 μm |
| 1 | $n^+$ GaAs | 500 nm | 500 nm | 500 nm |

U.S. PATENT DOCUMENTS

| | | | | |
|---|---|---|---|---|
| 5,323,030 | A | * | 6/1994 | Koscica et al. ............. 257/195 |
| 5,463,275 | A | | 10/1995 | Chen et al. ................. 313/495 |
| 5,675,157 | A | * | 10/1997 | Battersby ...................... 257/6 |
| 6,111,265 | A | * | 8/2000 | Twynam ........................ 257/6 |
| 6,207,977 | B1 | * | 3/2001 | Augusto ..................... 257/192 |
| 6,249,025 | B1 | * | 6/2001 | Tyagi ......................... 257/344 |
| 6,686,647 | B2 | * | 2/2004 | Kimura et al. .............. 257/604 |

OTHER PUBLICATIONS

Implant Isolation Scheme . . . by Hutchinson et al. Electronics Letter Apr. 25, 1996.

* cited by examiner

| Layer Number | Layer Material | Thickness of Layer A | Thickness of Layer B | Thickness of Layer C |
|---|---|---|---|---|
| 7 | n$^+$ GaAs | 500 nm | 500 nm | 500 nm |
| 6 | GaAs | - | - | 10 nm |
| 5 | GaAs→Al$_x$Ga$_{1-x}$As | 50 nm | 50 nm | 50 nm |
| 4 | GaAs | - | 5 nm | 10 nm |
| 3 | n$_d$ GaAs | 10 nm | 5 nm | 5 nm |
| 2 | n$^-$ GaAs | 1.6 μm | 1.6 μm | 1.6 μm |
| 1 | n$^+$ GaAs | 500 nm | 500 nm | 500 nm |

*Fig. 1*

LAYER SEQUENCE FOR GUNN DIODE

CROSS REFERENCE TO RELATED APPLICATIONS

This application is the U.S. national phase of PCT application PCT/DE2003/003867 filed 21 Nov. 2003 with a claim to the priority of German patent application 10261238.2 itself filed 20 Dec. 2002.

FIELD OF THE INVENTION

The invention relates to a layered structure or layer sequence, especially a layer sequence for a Gunn diode or a Gunn oscillator.

The Gunn effect relates to the appearance, upon the application of a constant relatively high electrical field strength (electrical field strength above 2000 V/cm) to an n-doped gallium arsenide crystal, of rapid current fluctuations. It has been found that, with very short crystals, these current fluctuations are transformed into related oscillations whose frequencies are determined by the length of the crystal and lie in the microwave range. Also in other semiconductive III-V semiconductors, like for example n-doped indium phosphide, a microwave effect can arise when the electrical field strength exceeds a critical value lying at several thousand V/cm. The effect arises generally in III/V semiconductors whose energy bands have relative maxima and minima which are spaced by a distance which is not very great energetically so that hot electrons can pass easily into higher-lying bands. If they there have a smaller mobility so that a smaller current amplitude is associated with the higher field strength, that is a negative resistance is present, the conditions for oscillation generation and amplification are present. The Gunn effect is thus used in so-called Gunn oscillators to produce the microwaves.

From a certain field strength, at an electron emitter, so-called spontaneous dipole domains can develop which travel through the semiconductor with a certain speed and end at a collector. When the domains arrive at the collector, a further domain is formed at the emitter. The emitter thus has a decisive significance in the formation of the domains. At the collector, the charge carriers are collected.

A Gunn diode can typically have an emitter with an AlGaAs layer oriented toward the collector and which serves to provide a potential drop for the emitter electrons and thus to boost them energetically relative to the active diode layer.

Form the publication Greenwald et al. (Greenwald, Z. Woodard, D. W., Calawa, A. R., Eastman, L. F. (1988) The effect of a high energy injection on the performance of millimeter wave Gunn oscillators; Solid-State Electronics 31, 1211-1214) a Gunn diode is known which has a layer structure or sequence with an AlGaAs layer of a constant aluminum content of 23%.

From U.S. Pat. No. 4,801,982 and Hutchinson et al. (Hutchinson, S., J. Stephens, M. Carr and M. J. Kelly. Implant isolation scheme for current confinement in graded-gap Gunn diodes, IEEE Electronics Letters, 32(9), 851-852, 1996) it is known to provide an AlGaAs layer with an aluminum content which is variable, that is increases in the direction of the collector linearly from zero to 30%. Such an AlGaAs layer is referred to in English as a graded layer and will be indicated as a graded layer hereinafter. The graded layer can be configured with a stepless transition to an aluminum content of higher concentration. As a result, advantageously, undesired electron reflections are minimized and electrons with energies matched to energy bands with low electron mobility can be injected.

The known layer sequence or structure of the state of the art has, because of high fabrication temperatures and/or high temperatures of use of the Gunn diode, the disadvantageous property that the desired potential barrier of the AlGaAs layer may be ineffective, that is electrically inactive. This is especially clear at low input voltages since then already a linear increase in the current as a function of the voltage arises.

OBJECT OF THE INVENTION

The object of the invention is thus to provide a layer sequence or structure which can provide a current/voltage characteristic-line or graph]—without the disadvantages described as the state of the art.

SUMMARY OF THE INVENTION

The object is achieved by the layer sequence or structure comprised of a sequence of layers applied one upon another and with a first highly doped $n_d$-GaAs layer, a graded AlGaAs layer disposed on the first highly doped $n_d$-GaAs layer whereby the aluminum concentration of this layer decreases from the interface to the first highly doped $n_d$-GaAs layer in the direction of the opposite boundary layer of the AlGaAs layer, and a second highly doped $n^+$ layer. On at least one boundary surface of the AlGaAs layer, juxtaposed to one of the highly doped layers, an undoped intermediate layer is arranged.

The AlGaAs layer and the highly doped $n^+$ layer form functionally the emitter of a Gunn diode or a Gunn oscillator. The highly doped $n_d$ GaAs layer bounding on the emitter serves to finely define the energy level of the dipole domain which is produced in the direction of a collector.

The undoped intermediate layer is comprised preferably also of GaAs. Such an intermediate layer acts advantageously to impart to the current/voltage characteristic a defined nonlinear relationship, that is a Schottky type of behavior at low voltages.

The starting material of the $n^+$ doped electron-emitting layer is advantageously also GaAs.

In a further feature of the invention, the AlGaAs layer has on both of its boundary surfaces, the highly doped layers, that is both the bounding $n^+$ doped electron-emitting layer as well as the highly doped $n_d$-GaAs layer, with such an undoped intermediate layer of GaAs being interposed between the respective doped layer and the AlGaAs. In this manner a further improvement of the current/voltage characteristic is obtained in such manner that these intermediate layers both at the emitter side as well as from the collector side of the graded layer will have a defined electronic structure.

Such a layer sequence or structure can be used as the starting layered body for Gunn diodes and Gunn oscillators. In that case, further layers may be joined to the highly doped $n_d$-GaAs layer for such electronic components.

On the end of the highly doped $n_d$-GaAs layer opposite the electronic-emitting layer, such further layers can be applied for these electronic components including especially a low-doped $n^-$-GaAs layer as will promote the Gunn effect as well as a further highly doped $n^+$-layer as a collector-forming layer. The collector layer can especially also be composed of GaAs.

As the doping agent for the layers, especially silicon and also tellurium have been found to be advanatageoud. These elements have the effect of advantageously contributing pure electron conductivity.

The method of making a layer sequence or structure according to the invention comprises the step whereby upon a highly doped $n_d$-GaAs layer, an undoped GaAs layer is applied and at an appropriate temperature is epitaxied. On this undoped intermediate layer, an AlGaAs layer is arranged with a variable aluminum concentration. The concentration is reduced steplessly away from the GaAs layer at its highest value, for example 30% to zero %. On the AlGaAs layer, then a further undoped GaAs layer is applied or a highly doped $n^+$-layer can be directly applied. The second undoped GaAs layer is then optional.

However, exactly the opposite method sequence can be carried out beginning with a highly doped $n^+$ layer of GaAs.

Thus at least one undoped GaAs layer is applied on at least one of the boundary surfaces of the AlGaAs layer to one or both of the highly doped layers, especially juxtaposed with the highly doped GaAs layers and is epitaxied at a suitable temperature.

It will be understood that a GaAs layer as a highly doped layer and as the intermediate layer can be applied on both boundary surfaces of the AlGaAs layer which are to be provided with the highly doped layers and epitaxied at appropriate temperatures.

The method according to the invention can be carried out advantageously in that during the chosen temperature of about 600° C. which is suitable for the epitactic growth of GaAs layers, no doping atoms diffuse into the AlGaAs layer or segregate. The AlgaAs layer is protected in this manner from doping atoms, for example of silicon or tellurium. These GaAs layers provide the function of diffusion blocking or diffusion stopping layers or of segregation stopping layers for doping atoms from adjoining highly doped regions in the layer sequence or structure. The GaAs layer functioning as a diffusion blocking layer or segregation blocking layer ensures that the layer sequence can be formed independently of the temperature. Consequently the layer sequence can be made at an ideal growth temperature of about 600° C. for GaAs. This has the additional advantage that potential very strong heating of the component even after fabrication and during its manufacture will not give rise to any temperature dependent degradation of the component.

BRIEF DESCRIPTION OF THE DRAWING

The invention is further described based upon two embodiments and the accompanying figures, in which:

FIG. 1 is a table describing the invention; and

SPECIFIC DESCRIPTION

Figure 2:
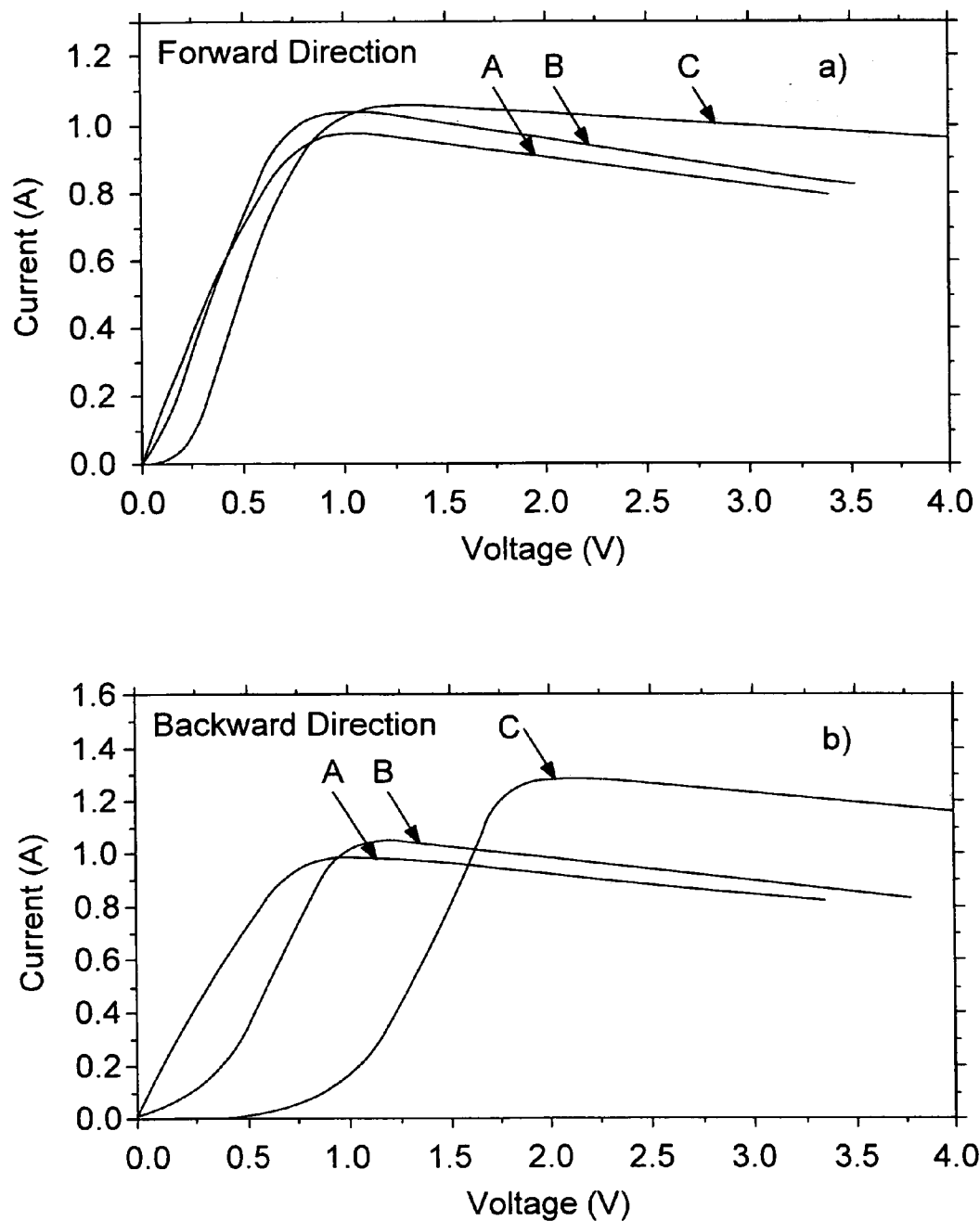
FIG. 2 is two diagrams describing the invention.

FIG. 1 shows in an overview three layer sequences A-C, with no GaAs layers as diffusion or segregation blocking layers 4, 6 and an AlGaAs layer 5 as the graded layer (Layer sequence A: State of the Art), a layer sequence B with one GaAs layer as the diffusion or segregation blocking layer 4, 6, and a layer sequence C with two additional GaAs layers as diffusion-blocking or segregation blocking layers 4, 6. The material for the individual layers of the layer sequence is identical in all three cases although the thicknesses can be varied as given in the columns A through C.

In the layer sequences A through C, the highly doped $n^+$GaAs layer 1 in each case constitutes a collector and serves as an electrical connection to the Gunn diode.

The collector 1 as the electrical feed is a highly doped $n^+$-GaAs layer doped with $4\times10^{18}$ cm$^{-3}$ silicon. On this an $n^-$-GaAs layer 2 with a lower level of silicon ($10^{16}$ cm$^{-3}$ silicon) is applied as a so-called transit zone and serves to maintain the Gunn effect. Opposite to the collector 1, an $n_d$-GaAs layer is arranged on layer 2. The doping of this layer 3 with silicon is $4\times10^{18}$ cm$^{-3}$ for the sequence layer A and $10^{18}$ cm-3 for each of the layer sequences B and C. Upon the 10 nanometer thick highly doped $n_d$-GaAs-layer 3, a 50 nanometer thick AlGaAs layer 5 is applied which at the boundary surface to the highly doped $n_d$-GaAs layer 3 has an aluminum concentration of 30% which falls, over the thickness of that layer, steplessly to zero percent. In the case of the layer sequence C a maximum aluminum concentration of 32% is formed in the layer 5. On the AlGaAs layer 5, the highly doped $n^+$-GaAs layer 7 is applied which is doped with $4\times10^{18}$ cm$^{-3}$ silicon.

Between the $N_d$GaAs-layer 3 and the AlGaAs layer 5 in the layer sequences B and C, an undoped GaAs layer 4 is additionally provided as a diffusion or segregation blocking layer. This layer is 5 nanometers thick in the case of the layer sequence B. In the layer sequence C, this layer has a thickness of 10 nanometers. In addition on the AlGaAs layer 5 in the layer sequence C a further 10 nanometer thick undoped GaAs layer 6 is provided on the AlGaAs layer.

FIG. 2 shows a comparison of the current versus voltage characteristics of the layer sequences A through C in the forward and rearward directions. The current versus voltage characteristic of the layer sequence A, differentiating from GaAs with an ideal growth temperature of 600° C., shows no Schottky-typical rise in the current versus 5 voltage characteristic. The curve rather begins with a straight line signifying properties of an ohmic resistance. The curve is further characterized by a symmetrical relationship for positive and negative supply voltages.

The incorporation of a diffusion or segregation blocking layer 4 beneath the graded AlGaAs layer 5 in layer sequence B already shows a significant improvement in the characteristic in terms of nonlinearity and thus good functioning of the AlGaAs layer. A Schottky type characteristic is clear in both the forward and background directions.

Sill more pronounced is the effect when a further diffusion or segregation blocking layer 6 (layer sequence C) is provided for the graded AlGaAs layer 5 and a diffusion of doping atoms from highly doped regions into the AlGaAs layer is suppressed at boundary surfaces toward highly doped layers. Then a very pronounced Shcottky type characteristic can be recognized (Curve C, FIG. 2).

While the characteristic for the layer sequence C demonstrates clearly the effect of a graded emitter it can be clearly seen from the curve A that the effectiveness of the AlGaAs layer can be lost. This latter effect is a function of the diffusion or segregation of the silicon doping substance of layer 7 or 3 into the AlGaAs layer 5 and results in electrical doping of the layer 5 and a change in its effectiveness.

It is conceivable within the scope of the invention to use a layer sequence according to the invention for further electronic components which require a potential barrier as the injection layer.

There are further layer sequences or structures conceivable in which the principle of protecting a graded layer, by undoped intermediate layers as diffusion-blocking or segregation blocking layers can be used, for example in the case of InP based layer sequences. In these layer sequences instead of GaAs as the material for the layer 1 to 7, InP can be used.

The invention claimed is:

1. A layer sequence or structure comprising:
    a first highly doped $n_d$-GaAs layer;
    a graded layer of AlGaAs on the first highly doped layer and having an aluminum concentration that diminishes, starting from a boundary surface with the first highly doped layer, in the direction of an opposite boundary surface of the AlGaAs layer;
    a second highly doped $n^+$-layer; and
    an undoped intermediate layer juxtaposed with the first or second highly doped layer and at least one boundary layer of the graded AlGaAs layer.

2. A layer sequence or structure in accordance with claim 1 wherein the undoped intermediate layer is composed of GaAs.

3. A layer sequence or structure in accordance with claim 1 wherein GaAs is the material for the second highly doped $n^+$-layer.

4. The layer sequence according to claim 1 wherein silicon or tellurium is the doping substrate.

5. The layer sequence or structure according to claim 1 wherein the layer sequence is arranged on further layers.

6. The layer sequence or structure according to claim 1 wherein the layer sequences is disposed on a $n^-$-GaAs layer.

7. The layer sequence of claim 6 wherein the $n^-$-GaAs layer is disposed on a highly doped $n^+$-layer of GaAs.

8. The layer sequence or structure according to claim 1 wherein the first highly doped $n_d$-GaAs layer or the second highly doped $n^+$-layer are doped with up to $10^{18}$ cm$^{-3}$ silicon.

9. A method of making a layer sequence or structure, the method comprising the steps of:
    providing a first highly doped $n_d$-GaAs layer as a substrate having a pair of opposite boundary surfaces,
    forming on one of the boundary surfaces of the first highly doped GaAs layer an undoped GaAs layer and epitaxiing the undoped GaAs layer at an appropriate temperature,
    providing on the undoped GaAs layer a graded AlGaAs layer; and
    providing on the other of the boundary surfaces a second undoped GaAs layer and epitaxiing the second undoped GaAs layer at an appropriate temperatures.

10. The method according to claim 9, further comprising the step of
    providing a further highly doped GaAs layer on the second undoped GaAs layer.

11. A layer sequence or structure comprising
    a first highly doped layer,
    a graded layer arranged on the first highly doped layer,
    a second highly doped layer, and
    an undoped intermediate layer juxtaposed between one of the highly doped layers and a boundary surface of the graded layer.

* * * * *